United States Patent
Robson et al.

(10) Patent No.: US 9,437,921 B2
(45) Date of Patent: Sep. 6, 2016

(54) OPTICALLY RECONFIGURABLE RF FABRIC

(71) Applicant: Raytheon Company, Waltham, MA (US)

(72) Inventors: Michael H. Robson, Albuquerque, NM (US); Michael T. Pace, Albuquerque, NM (US)

(73) Assignee: RAYTHEON COMPANY, Waltham, MA (US)

( * ) Notice: Subject to any disclaimer, the term of this patent is extended or adjusted under 35 U.S.C. 154(b) by 85 days.

(21) Appl. No.: 14/172,190

(22) Filed: Feb. 4, 2014

(65) Prior Publication Data

US 2015/0222019 A1    Aug. 6, 2015

(51) Int. Cl.
*H01Q 9/00* (2006.01)
*H01Q 1/36* (2006.01)
*H01L 21/00* (2006.01)
*H01Q 3/01* (2006.01)
*H01Q 9/04* (2006.01)

(52) U.S. Cl.
CPC ............ *H01Q 1/364* (2013.01); *H01L 21/00* (2013.01); *H01Q 3/01* (2013.01); *H01Q 9/0442* (2013.01)

(58) Field of Classification Search
CPC ................................. H01Q 9/045; H01P 1/00
USPC ...................... 343/904, 700 MS, 907, 702
See application file for complete search history.

(56) References Cited

U.S. PATENT DOCUMENTS

| | | | |
|---|---|---|---|
| 4,751,513 A * | 6/1988 | Daryoush et al. | 343/700 MS |
| 4,777,456 A * | 10/1988 | Andrikian et al. | 333/81 A |
| 4,835,500 A | 5/1989 | Sequeira | |
| 5,099,214 A * | 3/1992 | Rosen et al. | 333/157 |
| 5,481,232 A * | 1/1996 | Wu et al. | 333/161 |
| 5,514,499 A * | 5/1996 | Iwamatsu | G03F 1/144 378/34 |
| 5,761,351 A | 6/1998 | Johnson | |
| 6,313,803 B1 * | 11/2001 | Manasson et al. | 343/756 |
| 6,483,480 B1 | 11/2002 | Sievenpiper et al. | |
| 6,646,525 B2 | 11/2003 | Bozler et al. | |
| 7,271,877 B2 * | 9/2007 | Fries | G03F 7/70291 355/67 |
| 7,466,269 B2 | 12/2008 | Haziza | |
| 8,279,122 B2 | 10/2012 | Landon et al. | |
| 8,373,609 B1 | 2/2013 | Dorsey et al. | |

(Continued)

FOREIGN PATENT DOCUMENTS

| | | |
|---|---|---|
| EP | 1345419 B1 | 11/2009 |
| EP | 1753084 B1 | 8/2011 |
| EP | 2575211 A1 | 4/2013 |
| WO | 0120718 A1 | 3/2001 |

OTHER PUBLICATIONS

Korala et al., "Transparent conducting films of CdSe(ZnS) core (shell) quantum dot xerogels", Chem. Commun. vol. 48, 2012, pp. 8523-8525.

(Continued)

*Primary Examiner* — Peguy Jean Pierre
(74) *Attorney, Agent, or Firm* — Cantor Colburn LLP (57) ABSTRACT

A system to configure a planar microwave circuit, a method of forming a configurable planar microwave circuit, and a microwave circuit are described. The system includes a ground plane and a substrate disposed on the ground plane. The system also includes a photosensitive layer disposed on the substrate. A light source controllably changes a pattern of illumination on the photosensitive layer to controllably configure a transmission line in the photosensitive layer.

20 Claims, 13 Drawing Sheets

(56) References Cited

U.S. PATENT DOCUMENTS

| | | |
|---|---|---|
| 8,384,426 B2 | 2/2013 | Or-Bach |
| 2002/0043927 A1 | 4/2002 | Kimura |
| 2002/0085390 A1* | 7/2002 | Kiyomoto .............. B60Q 1/302 362/555 |
| 2004/0234270 A1* | 11/2004 | Nishie .................... H04B 10/40 398/141 |
| 2008/0136337 A1 | 6/2008 | Rogojevic et al. |
| 2013/0141295 A1 | 6/2013 | Jiang et al. |
| 2014/0168751 A1* | 6/2014 | Suzuki ................... G02B 26/08 359/291 |

OTHER PUBLICATIONS

Lilly et al., "Switchable photoconductivity of quantum dot films using cross-linking ligands with light-sensitive structures", Journal of Material Chemistry, vol. 21, No. 31, Aug. 21, 2011, pp. 11441-11652.

Mentzel et al., "Nanopatterned Electrically Conductive Films of Semiconductor Nanocrystals", Nano Letters 12, No. 8, Aug. 8, 2012, pp. 1-18.

\* cited by examiner

OPTICALLY RECONFIGURABLE RF FABRIC

BACKGROUND

The present disclosure relates to switchable conductivity. In many applications, mechanical supports are used for electrical connections. For example, a printed circuit board (PCB) provides mechanical support for the electrical connections between components. The PCB includes conductive traces that are placed onto an insulating substrate. The form of each conductive trace is fixed after the design is complete, while the function of the traces can be controlled using discrete components such as switches. Jumper wires may be added to implement the alternate routing as an alternative, but these connections can become loose and affect the integrity of the conductive traces such that only pathways that were anticipated during the design and layout phase of the PCB are practicable. Conductivity can refer to transmission of direct current as well as to radio frequency (RF) energy in transmission lines of RF or microwave circuits.

SUMMARY

According to one embodiment, a system to configure a planar microwave circuit includes a ground plane; a substrate disposed on the ground plane; a photosensitive layer disposed on the substrate; and a light source configured to controllably change a pattern of illumination on the photosensitive layer to controllably configure a transmission line in the photosensitive layer.

According to another embodiment, a method of forming a configurable planar microwave circuit includes disposing a substrate on a ground plane; disposing a photosensitive layer on the substrate; and configuring a light source above the photosensitive layer, the light source operable to overlay a pattern of illumination on the photosensitive layer to controllably configure a transmission line in the photosensitive layer.

According to yet another embodiment, a microwave circuit includes a ground plane; a substrate disposed on the ground plane; a photosensitive layer disposed on the substrate; and a transmission line formed in the photosensitive layer corresponding with a pattern of illumination on the photosensitive layer, the transmission line being configured to channel radio frequency energy and the transmission line being reconfigured based on a different pattern of illumination on the photosensitive layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As noted above, when alternative conductive paths (e.g., electrical connections, radio frequency pathways) are needed, they must be pre-placed and additional components, such as switches, must be included to facilitate any change in connectivity. For example, when a PCB is fabricated, the placement of the components and the connections between them are planned, and the connectivity paths between components are deposited. These connectivity paths carry the current from one component to another, for example. During operation of the circuit, if the connectivity paths need to be changed to modify the circuit for any reason, the change is possible if the PCB was fabricated with the additional connectivity paths as well as switches that facilitate the change. If no such additional paths and switching elements were implemented during fabrication of the PCB, the PCB must be modified to facilitate the change. Embodiments of the system and method detailed herein relate to dynamically configurable conductivity paths based on optically switchable elements. These switchable connectivity paths do not require pre-planning or additional components like switches. The system and method discussed herein apply to any surface or mechanical support with conductive traces or paths (e.g., circuit board, radome lining).

Additional embodiments described herein relate specifically to photonically routed transmission lines for transmission of radio frequency (RF) energy. Because the propagation of RF energy through a transmission line is affected by the cross-sectional geometry of the line and the conductivity of the material from which it is made, the switchable connectivity pathways defining transmission lines additionally include a determination of specific dimensions for the photoexcitation described below.

Additional embodiments described herein relate specifically to a system and method to selectively illuminate and thereby selectively excite (initiate conductivity of) the optically switchable elements. Additionally, embodiments of the interface and arrangement detailed below facilitate stacking of devices that include the optically switchable elements.

Further embodiments described herein relate specifically to photonically routed transmission lines for transmission of radio frequency (RF) energy. RF circuits perform the various processes that RF energy can be subjected to (e.g., filtering, modulation) before being transmitted or after being received. Just as conductive pathways channel direct current in electronic circuits, conductive transmission lines channel RF energy in RF circuits. Because the propagation of RF energy through a transmission line is affected by the cross-sectional geometry of the line, the optically generated pathways defining transmission lines additionally include a determination of specific dimensions for the pattern of photoexcitation described below. Still further embodiments of the interface and arrangement detailed below facilitate stacking of devices that include the optically switchable elements.

Additionally, using the dynamically configurable transmission lines in a stackable arrangement, as needed, embodiments of the system and method described herein relate to frequency agile antennas and, generally, planar microwave circuits. Current approaches to addressing frequency agility include employing integrated electronic switches, actuators, and other tunable materials that mechanically alter the circuit, using ultrawideband (UWB) or multiband antennas with tunable filters, or using single aperture multiband arrays. Examples of using tunable materials include micro-electro-mechanical systems (MEMS) loaded planar inverted F-antenna (PIFA) and slot-ring antennas, the pixel patch antenna, and MEMS based frequency switchable and polarization agile antennas. Other examples that use varactors are varactor-loaded patch antennas, frequency tunable differentially fed patch antennas, and adjustable high impedance surface arrays. PIN diodes have been used to make switchable Vivaldi antennas, reconfigurable ring-loaded patch arrays, and reconfigurable slot antennas. Mechanically reconfigurable antennas have also been designed. Examples include square ring-path antennas with ground-shorted parasitic patch flaps. In addition, frequency reconfigurability by tunable materials has also been explored. Examples include using ferroelectric dielectric materials to change permittivity or creating a surface plasma with SPIN diodes to alter the radiation pattern of the antenna. With regard to using UWB or multiband antennas, examples include the dual-polarized Vivaldi array, the frequency reconfigurable filtenna (filtered antenna), and dual-polarized UWB subarrays. With regard to using single aperture multiband arrays, multiple radiating elements are leveraged for different performances. Examples include the shared aperture antenna, multiband phased-array antenna with interleaved elements (e.g., C to X band elements with Ku-band waveguides interspersed), the dual-polarized planar-array antenna, dual-layer reflect array, and the dual-band dual-polarized antenna array. Most of the previous approaches involve long lead times and high costs, and the frequency agility measures may be defeated by counter measures. The dynamic reconfigurability of antennas according to embodiments described herein facilitates counter-counter measures.

Figure 1:
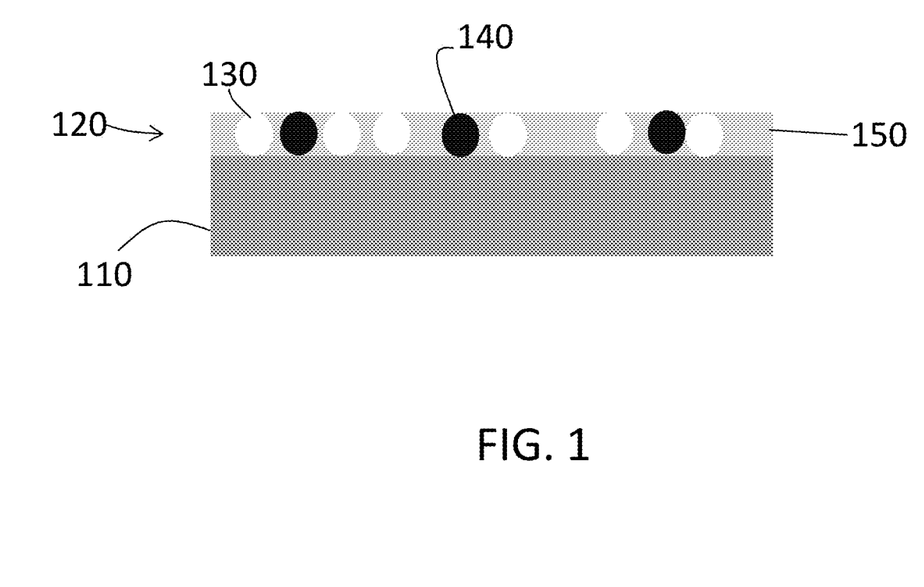
FIG. 1 is a cross-sectional view of a device with configurable conductivity paths according to an embodiment of the invention.

FIG. 1 is a cross-sectional view of a device with dynamically configurable conductivity pathways according to an embodiment of the invention. The embodiment shown in FIG. 1 includes a substrate 110 to mechanically support a photosensitive layer 120 with the configurable conductivity paths, but the exemplary embodiment does not limit the mechanical supports and shapes contemplated for the device. The substrate 110 is non-conductive and may be a dielectric layer. While the photosensitive layer 120 is shown as being deposited over one entire surface of the substrate 110 in FIG. 1, the photosensitive layer 120 may be deposited over at least a portion of at least one side of the substrate 110. The photosensitive layer 120 includes at least one type of optical switching element (OSE) 130, and may also include at least one type of field transmission element (FTE) 140, and one or more types of an immobilizing material (IM) 150. When the IM 150 is present, the OSE 130 and FTE 140 are fillers in the IM 150, which is the body of the film making up the photosensitive layer 120. The IM 150 is made from a material or a blend of materials that are transparent to high energy photons and provides mechanical and environmental stability to the fillers (OSE 130 and FTE 140). For example, the IM 150 may be a polymethyl methacrylate (PMMA), poly isobutylene (PIB), or poly ether imide (PEI). When the IM 150 is present, the filling factor must be sufficiently high for the fillers (OSE 130 and FTE 140) to be in electrical contact with one another but must also be sufficiently low such that the integrity of the resulting film is upheld. A ratio of FTE 140 to OSE 130 is material-dependent. A lower ratio (increasingly more OSE 130 than FTE 140) provides for higher resolution of conductive features when the photosensitive layer 120 is illuminated but higher transparency (radio frequency transparency) when the photosensitive layer 120 is not illuminated, while a higher ratio (increasingly more FTE 140 than OSE 130) provides for higher conductivity when the photosensitive layer 120 is illuminated and lower transparency (radio frequency transparency) when the photosensitive layer 120 is not illuminated.

The OSE 130 is a nanostructured semiconductor material that is sensitive to high energy photons. For example, the OSE 130 may include quantum dots (IIB-VIA, IVA-VIA, or IIIA-VA), vanadium oxide ($VO_2$), silicon nanoparticles, a semiconducting polymer, or other semiconducting material. The OSE 130 material can be induced to an electrically conductive state by the absorption of the photon. That is, when a light source illuminates the OSE 130, causing photoexcitation, the illuminated OSE 130 becomes conductive. Accordingly, a path of OSE 130 material may be illuminated to define a conductivity path within the photosensitive layer 120. The structure of the OSE 130 includes one or more materials that passivate the surface of the OSE 130 and thereby alter the material properties of the OSE 130. The FTE 140 is an inherently conductive nanostructured material. For example, the FTE 130 may include silver, copper, or gold nanoparticles (or another intrinsically conductive material) and may define the nano-particulate equivalent of a transmission line. Exemplary materials that may be used as FTE 130 (and may also be used as passivating material or IM 150) include poly(3,4-ethylenedioxythiophene) poly(styrenesulfonate) (PEDOT:PSS), polyaniline (PANI), and poly(3-hexylthiophene) (P3HT). The FTE 140 may also include one or more passivating materials. These passivating materials may or may not be the same as the passivating materials in the structure of the OSE 130. Exemplary passivating materials include n-butylamine (n-But), ethanedithiol (EDT), and ethanediamine (EDA).

Figure 2:
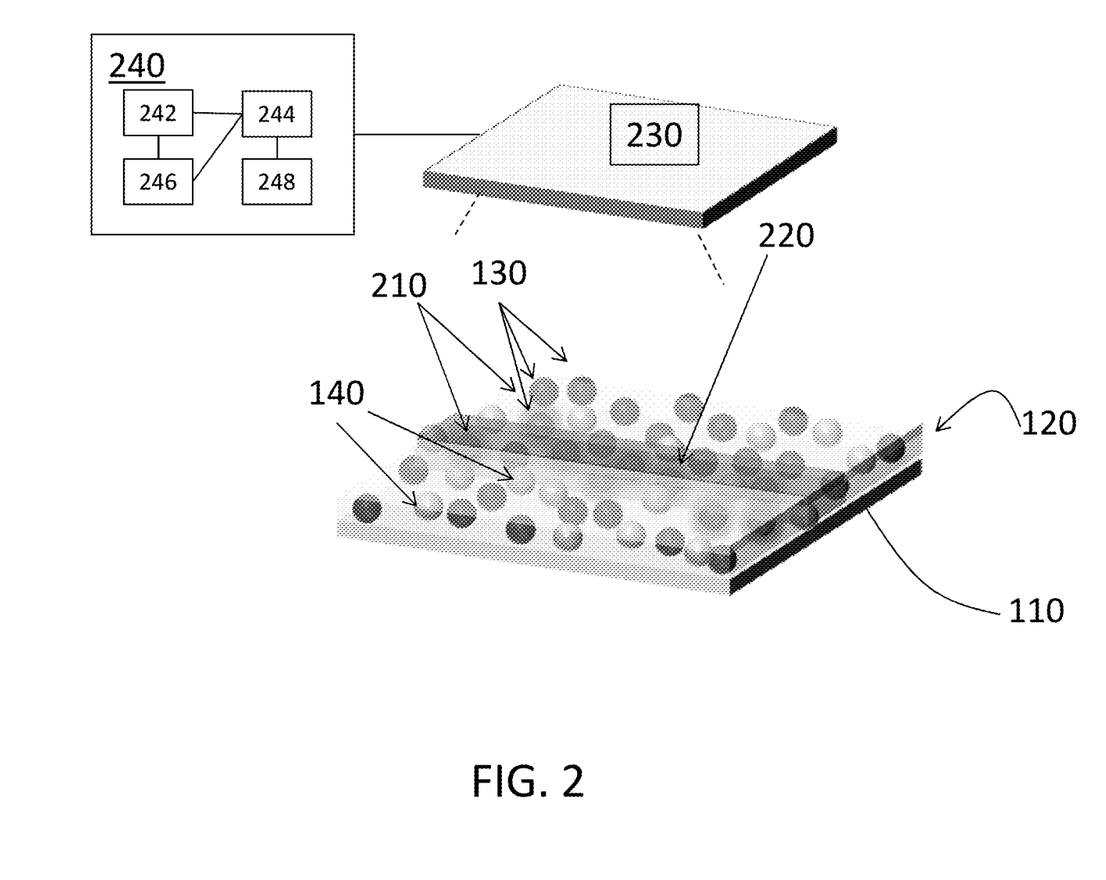
FIG. 2 shows a system to dynamically configure a conductive pathway according to an embodiment of the invention.

FIG. 2 shows a system to dynamically configure a conductive pathway according to an embodiment of the invention. As noted with reference to FIG. 1, the exemplary arrangement of the photosensitive layer 120 on the substrate 110 is not intended to limit the arrangement of the device. Both the OSE 130 and FTE 140 are shown as part of the photosensitive layer 120. The OSE 130 that are illuminated by a light source 230 (e.g., ultraviolet light. x-ray, visible, or other high energy light) are indicated by 210. While the light source 230 is shown separated from the photosensitive layer 120 in FIG. 2 for clarity, the light source 230 may be disposed directly on the photosensitive layer 120 to accurately control the areas of the photosensitive layer 120 that are illuminated. In alternate embodiments, backlighting or projection may be used to illuminate the OSE 130. A controller 240 may be used to control the light source 230. The controller 240 includes an input interface 242 (e.g., keyboard, output of another circuit), one or more processors 244, one or more memory devices 246, and an output interface 248 that outputs the signal to control the light source 230. The OSE 130 (210) that is illuminated forms conductive layers while the unilluminated OSE 130 (dark regions) are insulating. The specific regions that are conductive or that create conductive pathways between components when the device shown in FIG. 2 is incorporated in a circuit, for example, can be altered dynamically by changing the pattern of illumination. Thus, without apriori knowledge of conductive paths needed in the device, for example, the illumination by the light source 230 may be adjusted to dynamically form the conductivity path in the photosensitive layer 120.

Figure 3:
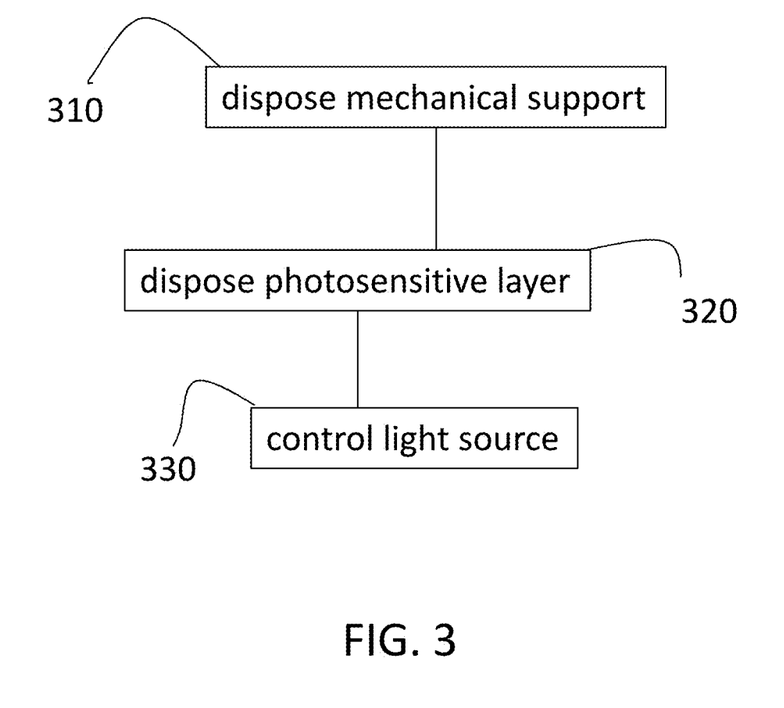
FIG. 3 is a process flow of a method of forming a dynamically configurable conductivity pathway according to an embodiment of the invention.

FIG. 3 is a process flow of a method of forming a dynamically configurable conductivity pathway according to an embodiment of the invention. At block 310, disposing a mechanical support includes disposing a substrate 110 for a circuit, for example. As noted above, the mechanical support may be any non-conductive surface on which the photosensitive layer 120 may be disposed. The mechanical support may be a radome, for example. At block 320, disposing the photosensitive layer 120 includes depositing the photosensitive layer 120 on at least part of at least one side of the mechanical support. As detailed above, the photosensitive layer 120 may include OSE 130 and FTE 140 that may be fillers in an IM 150. Controlling a light source 230 at block 330 facilitates changing conductivity of the OSE 130 in the photosensitive layer 120 to dynamically configure conductivity paths.

As noted above, additional embodiments relate specifically to dynamically routing RF energy in a transmission line. For example, the device shown in FIG. 2 may be a circuit board for an antenna, and the substrate 110 may be transparent to RF and include an internal ground plane. Components and connectors may be mounted to the surface or edge of the device. The dimensions (e.g., width, depth) of a transmission line (e.g., 220 in FIG. 2) affect the propagation of transmitted RF energy through the line. That is, the transmission line dimensions must be chosen based on the wavelength of RF energy to be transmitted, because the dimensions affect impedance, and impedance matching maximizes power transfer by preventing reflections. Thus, un-optimized transmission line dimensions will result in higher loss of signal. Accordingly, unlike the transmission of direct current through a conductive pathway, which is unaffected by the shape of the conductivity pathway trace, for example, the transmission of RF energy through a transmission line requires a determination of the proper dimensions for the transmission link. As noted above, the light source 230 may be used (controlled by a controller 240) to illuminate OSE 130 and thus initiate conductivity within the illuminated area of the photosensitive layer 120. As described below, when the necessary dimensions for the illuminated area are determined and the light source 230 is used to illuminate OSE 130 within the determined dimensions, a transmission link for routing of RF energy may be dynamically configured. The conductive traces created by the light source 230 form adaptable planar microwave circuits. Exemplary applications for the resulting device include filters, phase shifters, matching networks, patch radiators, and power dividers. Just as the conductivity pathways discussed above may be added or removed based on illumination by the light source 230, transmission lines may also be added or removed. In addition, the transmission lines may be modified (based on a modification in RF energy to be transmitted) by changing the dimensions of illumination with the same area of the photosensitive layer 120.

Figure 4:
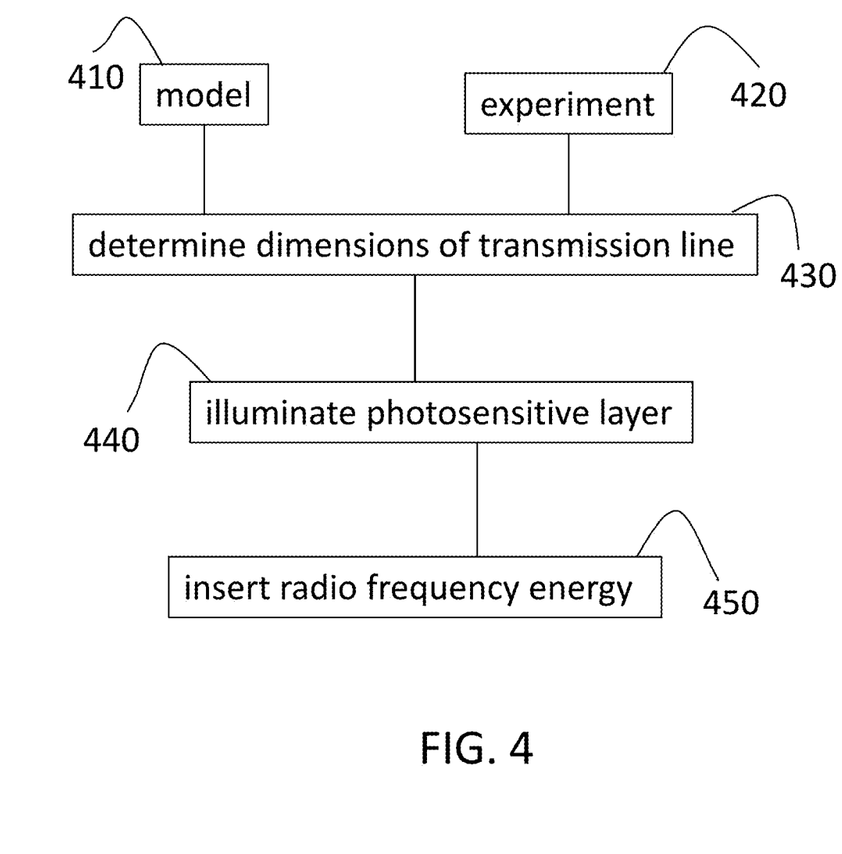
FIG. 4 is a process flow of a method of dynamically routing a transmission line according to an embodiment of the invention.

FIG. 4 is a process flow of a method of dynamically routing a transmission line according to an embodiment of the invention. At block 410, modeling may be conducted. At block 420, experimenting may be used. A combination of modeling and experimentation (e.g., modelling experimentally) may also be used for determining the dimensions needed for the transmission line (at block 430) based on the RF energy to be transmitted. Determining the dimensions of the transmission line may be done by the same controller 240 (FIG. 2) that controls the light source 230 or by one or more other controllers that provide input to the controller 24 that controls the light source 230. At block 440, illuminating the photosensitive layer 120 (the OSE 130) initiate conductivity in the illuminated area of the photosensitive layer 120 which corresponds with the dimensions determined for the transmission line (430). The illuminated OSE 130 are conductive to alternating current during photoexcitation. The OSE 130 are insulating to alternating current when not illuminated. Noting that radio frequency signals are carried by alternating currents with frequencies in the range of 3 kilohertz to 300 gigahertz, the excitation of OSE 130 within the photosensitive layer 120 with particular dimensions facilitates dynamic creation of transmission lines for routing radio frequency energy. Accordingly, dynamically creating the proper transmission line (through the illumination at block 440) for impedance matching facilitates inserting RF energy for transmission at block 450.

Figure 5:
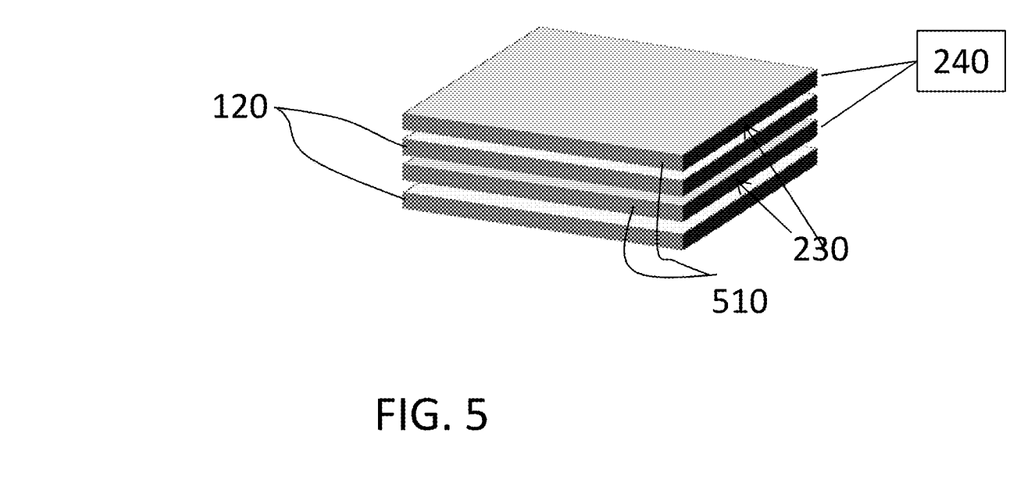
FIG. 5 shows a stacked system of dynamically switchable conductivity pathways according to an embodiment of the invention.

As noted above, additional embodiments relate specifically to selectively illuminating OSE 130 using an arrangement that facilitates stacking of devices that have the dynamically switchable conductivity pathways. FIG. 5 shows a stacked system of devices including dynamically switchable conductivity pathways according to an embodiment of the invention. Although shown with gaps between the layers in FIG. 5 for clarity, the layers may be disposed directly on top of one another. The exemplary system shown in FIG. 5 includes two photosensitive layers 120 (which may each be supported by a substrate 110), each with a corresponding light source 230 that is a layer of LEDs 510. The layer of LEDs 510 is used as one example, but a bulk semiconductor layer, layer of organic LEDs (OLEDs), or layer of quantum dots may be used, as well. Each layer of LEDs 510 may be controlled by one or more controllers 240. Specifically, the input interface 242 of the controller 240 may be a graphical user interface (GUI) that facilitates an input of the portions of the photosensitive layer 120 to be illuminated (photoexcited) based on selecting pixels of LEDs 510 among the layer of LEDs 510 for illumination. A user selects an image through the GUI, and the image is superimposed via photoexcitation by the LEDs 510 on the OSE 130 within an area of the photosensitive layer 120 corresponding with the image. The selected LEDs 510 emit ultraviolet light, for example, to photoexcite the corresponding OSE 130 in the photosensitive layer 120. The selected LEDs 510 may alternatively emit visible light. Because the light source 230 (layer of LEDs 510) is disposed on the respective photosensitive layer 120, as shown in FIG. 5, rather than arranged at a distance or for backlighting, for example, the light source 230 need not be the top layer. Instead, another device which may include another photosensitive layer 120 can be stacked above the layer of LEDs 510. As is clear from FIG. 4, any number of devices may be stacked in the manner illustrated by FIG. 5.

Figure 6:
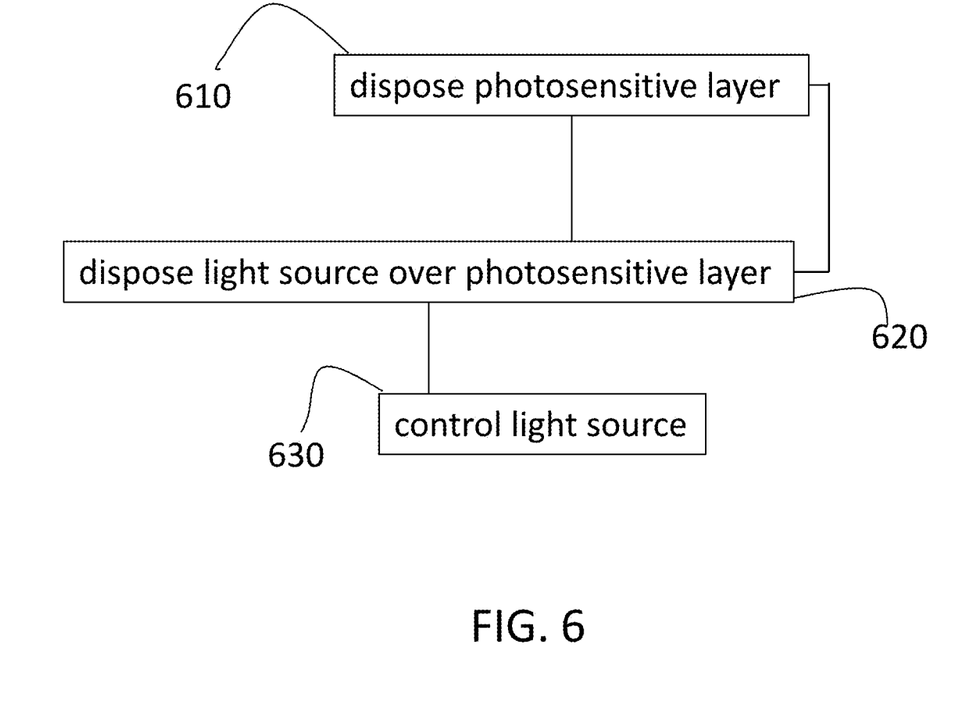
FIG. 6 is a process flow of a method of forming a system of configurable conductivity pathways according to an embodiment of the invention.

FIG. 6 is a process flow of a method of forming a system of configurable conductivity pathways according to an embodiment of the invention. In particular, a system of stacked devices with configurable conductivity pathways may be formed according to embodiments of the invention. At block 610, disposing a photosensitive layer 120 may be over a mechanical support like a substrate 110. At block 620, disposing a light source 230 over the photosensitive layer 120 includes disposing a layer of LEDs 510 directly over the photosensitive layer 120. Blocks 610 and 620 may be repeated to stack multiple devices including a photosensitive layer 120 and a layer of LEDs 510. At block 630, controlling the light source 230 includes using a controller 240. The same or a different controller 240 may be used for each layer of LEDs 510. The input interface 242 of the controller 240 may include a GUI that facilitates the input of an image by a user. The controller 240 then imposes that image, in the form of illuminated LEDs 510 among the layer of LEDs 510, onto the photosensitive layer 120.

As noted above, transmission lines may be configured and reconfigured in the photosensitive layer 120 based on controlling the geometry of the illuminated (photoexcited) portion of OSE 130. As also noted above, a layer of LEDs 510 deposited over the photosensitive layer 120 may be controlled, via a GUI, for example, to facilitate the stacking of devices that have reconfigurable conductive pathways. Specific embodiments of the present invention relate to planar microwave circuits. These embodiments are directed to transmission lines for microwave energy (e.g., 300 mega Hertz (MHz) to 300 gigahertz (GHz)).

Figure 7:
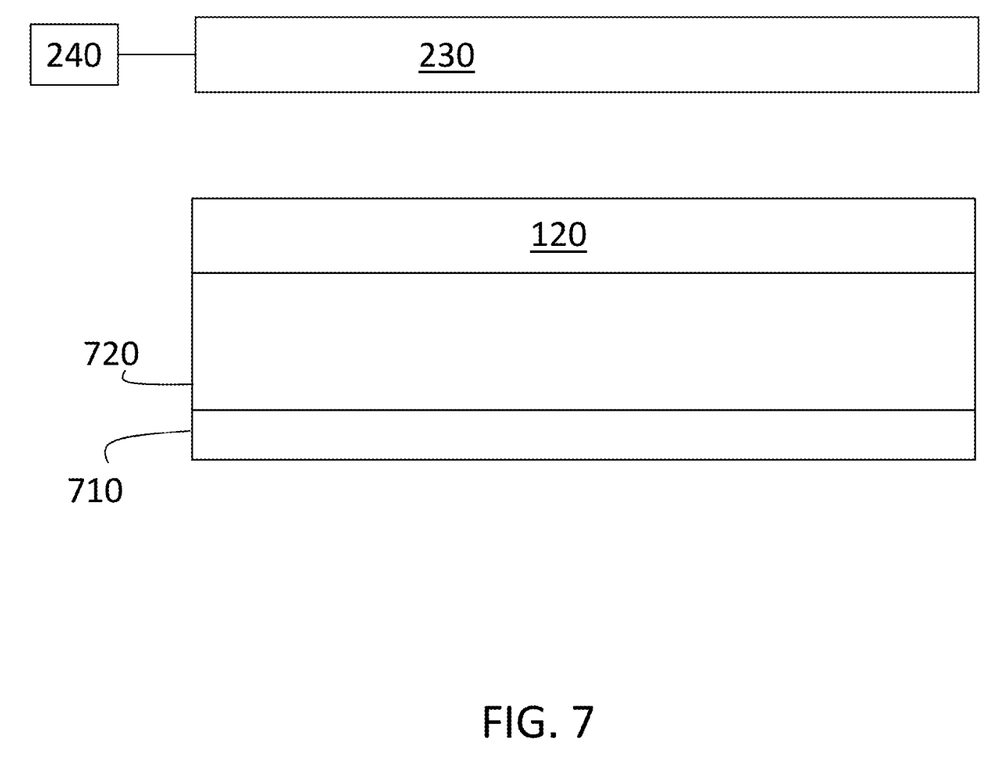
FIG. 7 is a cross-sectional view of a planar microwave circuit according to an embodiment of the invention.
Figure 8:
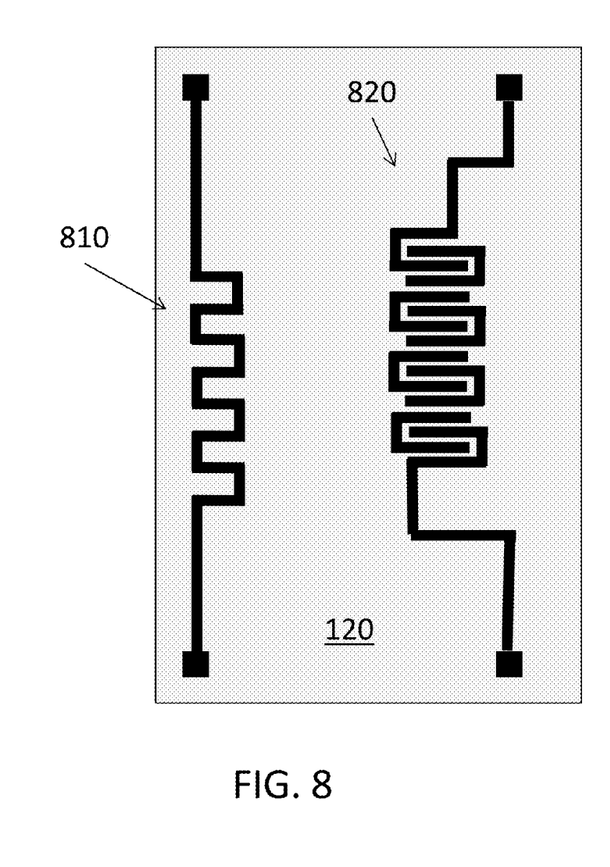
FIG. 8 illustrates an exemplary planar microwave circuit formed based on photoexcitation according to embodiments of the invention.
Figure 9:
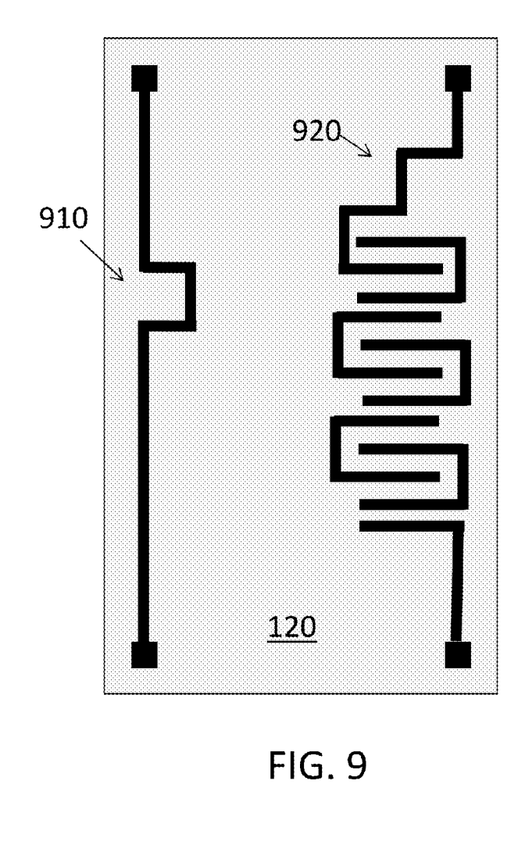
FIG. 9 illustrates another exemplary planar microwave circuit formed based on photoexcitation according to embodiments of the invention.

FIG. 7 is a cross-sectional view of a planar microwave circuit according to an embodiment of the invention. The planar microwave circuit is formed by stacking a metal layer 710 (e.g., copper Cu), a dielectric layer 720, and photosensitive layer 120 as shown, with a light source 230 above (as shown) or layered on the photosensitive layer 120. The controller 230 may control the light source 230 to illuminate an area of the photosensitive layer 120 corresponding with an image input through a GUI, as described above. Based on the illumination (photoexcitation) of the photosensitive layer 120 (the OSE 130 within the photosensitive layer 120), the exemplary planar microwave circuits shown in FIGS. 8 and 9 may be formed. FIG. 8 illustrates exemplary planar microwave circuits formed based on photoexcitation according to embodiments of the invention. FIG. 8 shows a delay line 810 and a radio frequency (RF) filter. FIG. 9 illustrates additional exemplary planar microwave circuits formed based on photoexcitation according to embodiments of the invention. FIG. 9 shows an exemplary planar microwave circuit including a phase shifter 910 and a tunable RF filter 920. To be clear, by changing the pattern of illumination on the photosensitive layer 120, the exemplary circuits (810, 820) shown in FIG. 8 may become the exemplary circuits shown in FIG. 9 (the planar microwave circuit shown in FIG. 8 may be dynamically reconfigured into the planar microwave circuit shown in FIG. 9). This reconfiguration would be accomplished simply by changing the pattern of the light source 230 illuminating the photosensitive layer 120. Additional examples of planar microwave circuits that may be configured based on illumination of the photosensitive layer 120 of the device shown in FIG. 7 include a matching network and power divider.

Figure 10:
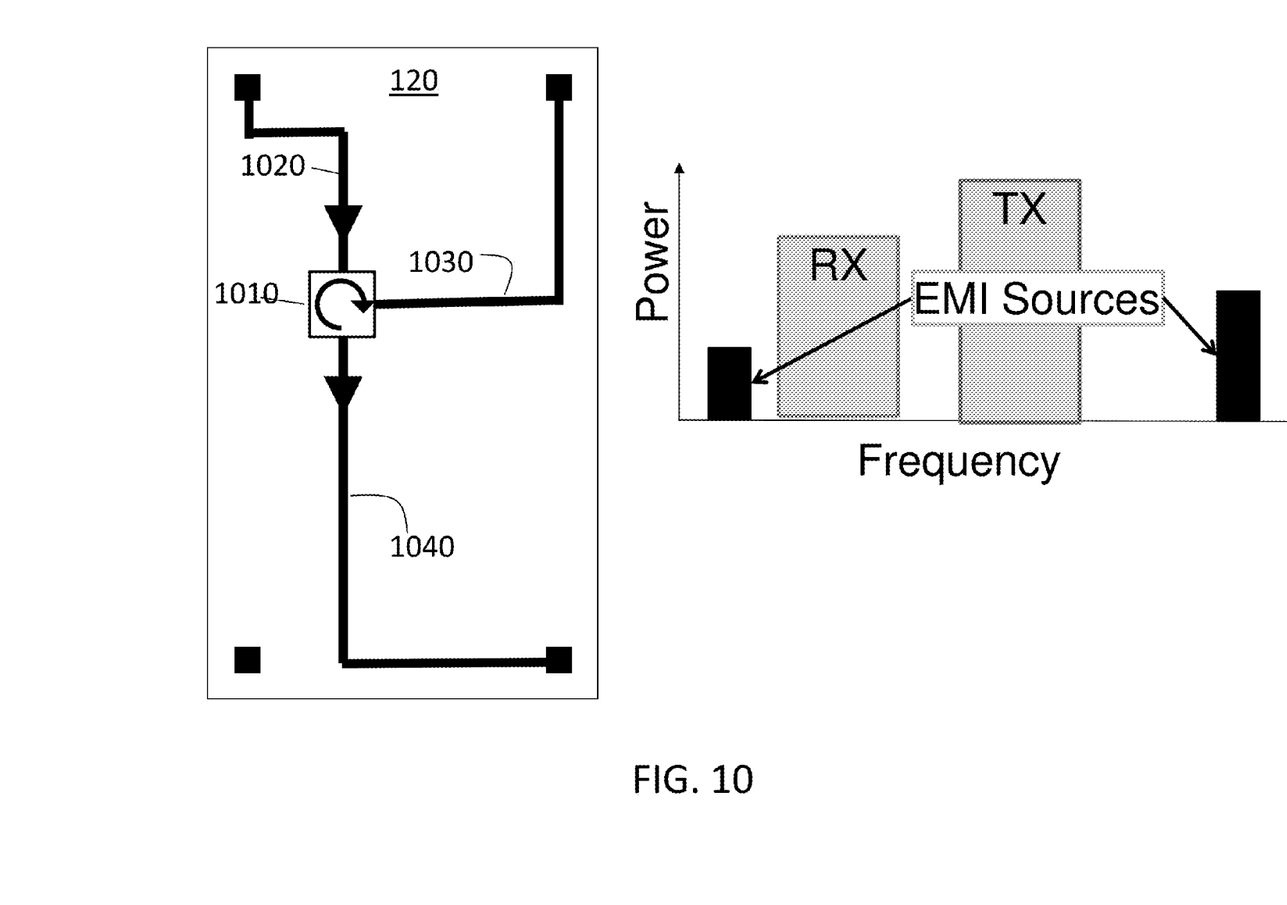
FIG. 10 illustrates a planar microwave circuit according to an embodiment of the invention.
Figure 11:
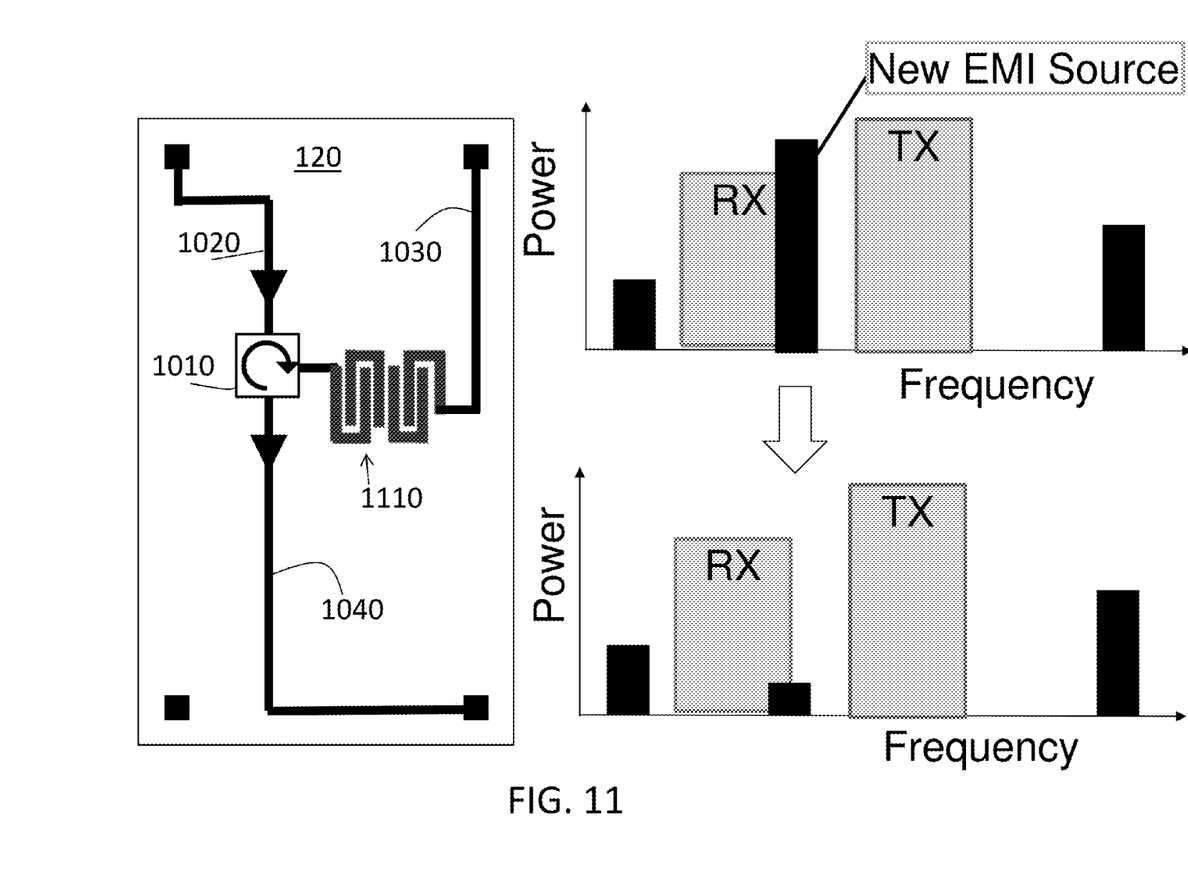
FIG. 11 illustrates a reconfiguration of the planar microwave circuit shown in FIG. 10 according to an embodiment of the invention.

FIGS. 10 and 11 illustrate an application for the reconfigurability according to an embodiment of the invention. FIG. 10 illustrates a planar microwave circuit according to an embodiment of the invention. The circuit includes a circulator 1010 that directs RF energy coming in from transmission line 1020 to transmission line 1030 (to the antenna aperture) and directs RF energy coming in on transmission line 1030 from the antenna aperture to transmission line 1040. As FIG. 10 shows, there are two known electromagnetic interference sources (EMI) whose interference signals are lower in power than the transmitter signal (on transmission line 1020) and the receiver signal (on transmission line 1040). FIG. 11 illustrates a reconfiguration of the planar microwave circuit shown in FIG. 10 according to an embodiment of the invention. As FIG. 11 shows, a new EMI source may be detected that emits an interference signal with a power that exceeds that of the transmitted signal and the received signal. Because the circuit shown in FIG. 10 is easily reconfigured based on the pattern of light from the light source 230 that illuminates the photosensitive layer 120, a notch filter 1110 may be added to address the EMI source, as shown in FIG. 11.

Figure 12:
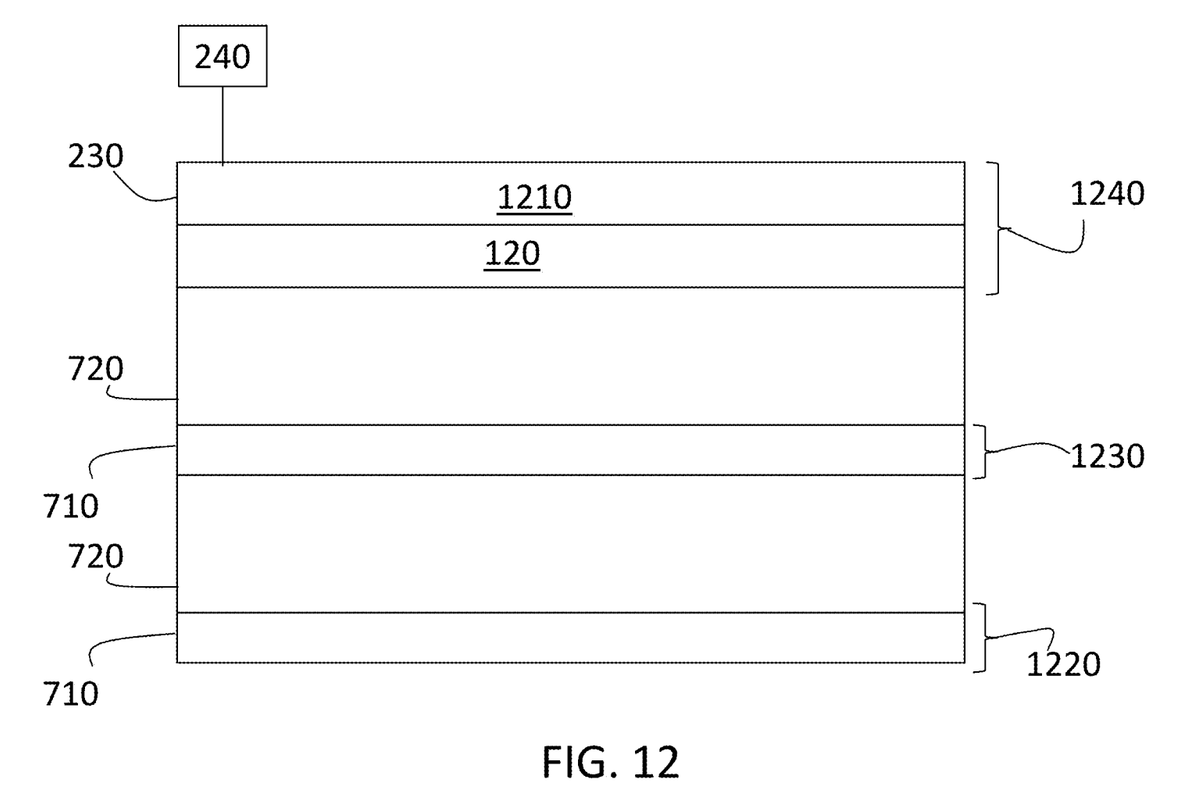
FIG. 12 is a cross-sectional view of a patch antenna according to embodiments of the invention.
Figure 13:
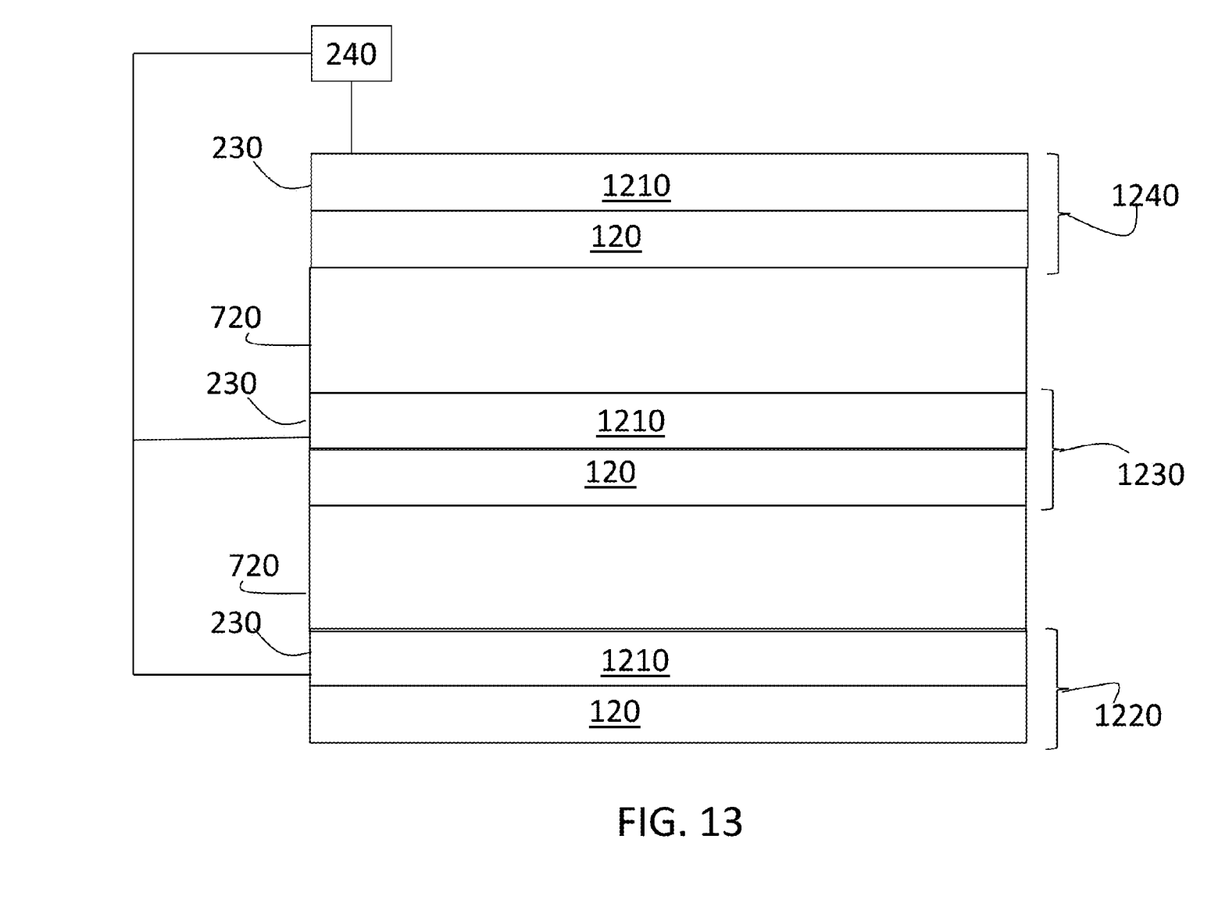
FIG. 13 is a cross-sectional view of a patch antenna according to another embodiment of the invention.

FIG. 12 is a cross-sectional view of a patch antenna according to embodiments of the invention. A metal layer 710 (e.g., Cu) makes up the microstrip transmission line layer 1220 and has a dielectric layer 720 stacked above. Another metal layer 710 disposed on the dielectric layer 720 makes up the ground plane 1230 or aperture layer. Another dielectric layer 720 separates this ground plane 1230 from a photosensitive layer 120 with a light source 230 deposited on it. The light source 230 may be an organic LED (OLED) layer 1210, and the photosensitive layer 120 and OLED layer 1210 make up the patch layer 1240. A controller 240 may overlay an image (pattern) of light, based on input of the image by a user through a GUI, for example, on the photosensitive layer 120 to configure the patch layer 1240. FIG. 13 is a cross-sectional view of a patch antenna according to another embodiment of the invention. As FIG. 13 illustrates, the metal layers 710 making up the microstrip transmission line layer 1220 and the ground plane 1230 may both be replaced by a configurable layer comprising a photosensitive layer 120 and a light source 230 (e.g., OLED layer 1210). Each of the OLED layers 1210 may be controlled by one or more controllers 240.

Figure 14:
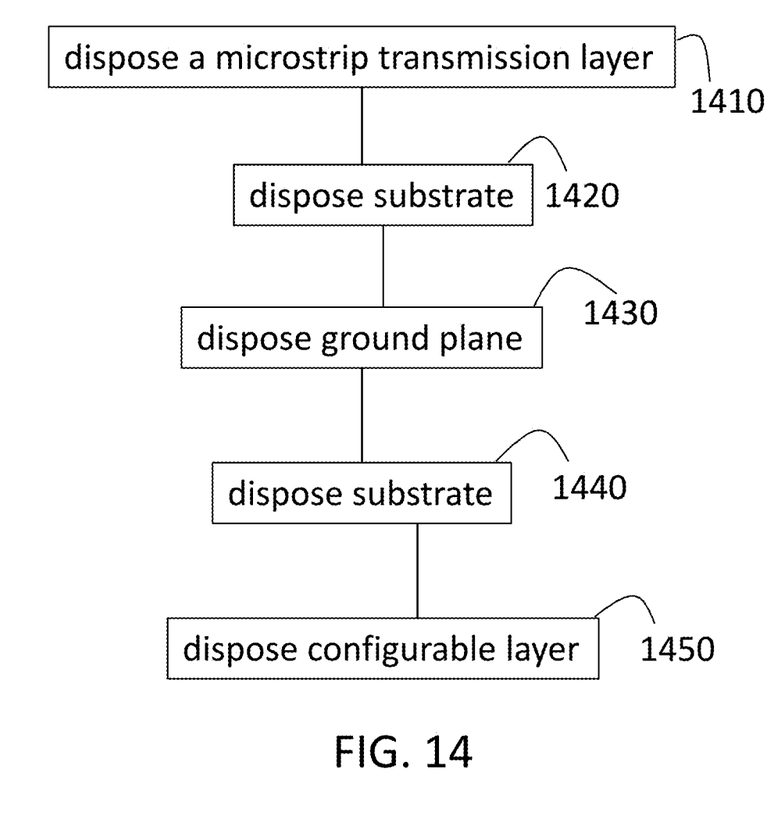
FIG. 14 is a process flow of a method of forming a configurable planar microwave circuit according to embodiments of the invention.

FIG. 14 is a process flow of a method of forming a configurable planar microwave circuit according to embodiments of the invention. At block 1410, disposing a microstrip transmission layer 1220 is optional. The microstrip transmission layer 1220 may be a metal layer 710 such as copper or may be comprised of a photosensitive layer 120 and a light source 230 such as a layer of OLEDs 1210. At block 1420, disposing a substrate 720 includes disposing a dielectric layer and is done when the microstrip transmission layer 1220 is included. At block 1430, disposing a ground plane 1230 (aperture layer) includes disposing a metal layer 710 or a photosensitive layer 120 and light source 230, such as a layer of OLEDs 1210. At block 1440, disposing a substrate 720 includes disposing a dielectric layer. At block 1450, disposing a configurable layer may be a patch layer and includes a photosensitive layer 120 and a light source 230. The light source 230 may be a layer of OLEDs 1210 deposited over the photosensitive layer 120.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A system to configure a planar microwave circuit, comprising:
    a ground plane;
    a substrate disposed on the ground plane;
    a photosensitive layer disposed on the substrate; and
    a light source configured to controllably illuminate a selected portion of the photosensitive layer according to a pattern to controllably configure a transmission line only in the selected portion of the photosensitive layer corresponding with the pattern.

2. The system according to claim 1, wherein the ground plane is a copper plane and the substrate is a dielectric layer.

3. The system according to claim 1, wherein the light source is configured to illuminate the photosensitive layer through backlighting or through projection.

4. The system according to claim 1, wherein the planar microwave circuit is one of a filter, phase shifter, matching network, or power divider.

5. The system according to claim 1, further comprising a microstrip transmission line layer and a second substrate disposed on the microstrip transmission line layer, the ground plane being disposed on the second substrate.

6. The system according to claim 5, wherein the planar microwave circuit is a patch antenna, a patch layer of the patch antenna comprises the photosensitive layer and the light source, the light source being a layer of organic light-emitting diodes (OLEDs).

7. The system according to claim 6, wherein the microstrip transmission line layer and the ground plane are comprised of copper, and the second substrate is a dielectric layer.

8. The system according to claim 6, wherein the microstrip transmission line layer includes a second photosensitive layer and a second layer of OLEDs and the ground plane includes a third photosensitive layer and a third layer of OLEDs, the second substrate is a dielectric layer, and the second layer of OLEDs and the third OLEDs are controlled to control conductivity of the second photosensitive layer and the third photosensitive layer, respectively.

9. A method of forming a configurable planar microwave circuit, the method comprising:
    disposing a substrate on a ground plane;
    disposing a photosensitive layer on the substrate; and
    configuring a light source above the photosensitive layer, the light source operable to illuminate a selected portion of the photosensitive layer according to a pattern to controllably configure a transmission line only in the selected portion of the photosensitive layer corresponding with the pattern.

10. The method according to claim 9, wherein the disposing the substrate on the ground plane includes disposing a dielectric layer on a copper plane.

11. The method according to claim 9, wherein the configuring the light source to overlay the pattern of illumination includes configuring the light source to illuminate the photosensitive layer through backlighting or through projection.

12. The method according to claim 9, wherein the forming the configurable planar microwave circuit includes forming a filter, phase shifter, matching network, or power divider.

13. The method according to claim 9, further comprising disposing a microstrip transmission line layer and a second substrate disposed on the microstrip transmission line layer and disposing the ground plane on the second substrate.

14. The method according to claim 13, wherein the forming the configurable planar microwave circuit includes forming a patch antenna, and forming a patch layer includes the disposing the photosensitive layer and depositing a layer of organic light-emitting diodes (OLEDs) as the light source over the photosensitive layer.

15. The method according to claim 14, wherein the disposing the microstrip transmission line layer and the disposing the ground plane both include disposing a copper layer, and the disposing the second substrate includes disposing a dielectric layer.

16. The method according to claim 14, wherein the disposing the microstrip transmission line layer includes disposing a second photosensitive layer and depositing a second layer of OLEDs on the second photosensitive layer, and the disposing the ground plane includes disposing a third photosensitive layer and depositing a third layer of OLEDs on the third photosensitive layer.

17. The method according to claim 16, further comprising configuring the second layer of OLEDs and the third layer of OLEDs to control conductivity of the second photosensitive layer and the third photosensitive layer, respectively, based on input from a controller.

18. A microwave circuit, comprising:
    a ground plane;
    a substrate disposed on the ground plane;
    a photosensitive layer disposed on the substrate; and
    a transmission line formed in an illuminated portion of the photosensitive layer corresponding with a pattern, the transmission line being configured to channel radio frequency energy and the transmission line being reconfigured based on illumination of a different portion of the photosensitive layer.

19. The microwave circuit according to claim 18, wherein the ground plane is a copper plane and the substrate is a dielectric layer.

20. The microwave circuit according to claim 18, wherein the microwave circuit is one of a filter, phase shifter, matching network, or power divider.

* * * * *